United States Patent [19]

Inayoshi et al.

[11] Patent Number: 4,803,543
[45] Date of Patent: Feb. 7, 1989

[54] SEMICONDUCTOR DEVICE AND PROCESS FOR PRODUCING THE SAME

[75] Inventors: Hideo Inayoshi, Kokubunji; Akira Suzuki, Ome; Kunihiro Tsubosaki, Hino; Toyoichi Ueda, Katsuta; Daisuke Makino; Nobuo Ichimura, both of Hitachi; Kazunari Suzuki, Tokyo, all of Japan

[73] Assignees: Hitachi, Ltd.; Hitachi Chemical Co.; Hitachi Microcomputer Engineering Ltd., all of Tokyo, Japan

[21] Appl. No.: 327,554

[22] Filed: Dec. 4, 1981

[30] Foreign Application Priority Data

Dec. 10, 1980 [JP] Japan ................................. 55-173287

[51] Int. Cl.4 ...................... H01L 23/28; H01L 39/02
[52] U.S. Cl. ........................................ 357/72; 357/79; 357/80; 156/330
[58] Field of Search ..................... 156/330; 357/79, 80, 357/72

[56] References Cited

U.S. PATENT DOCUMENTS

| | | | |
|---|---|---|---|
| 3,600,246 | 8/1971 | Breen .................................. | 156/330 |
| 3,811,183 | 5/1974 | Celling ................................ | 156/330 |
| 3,849,187 | 11/1974 | Fetscher et al. ....................... | 357/72 |
| 3,975,757 | 8/1976 | Sporck ................................ | 357/72 |
| 4,076,869 | 2/1978 | Flynn . | |
| 4,210,704 | 7/1980 | Chandross et al. ................. | 156/330 |
| 4,248,920 | 2/1981 | Yoshizumi et al. .................. | 357/72 |
| 4,297,401 | 10/1981 | Chern et al. ....................... | 156/330 |
| 4,298,883 | 11/1981 | Komatsu et al. ...................... | 357/72 |
| 4,356,505 | 10/1982 | Lovinger ............................ | 357/72 |

FOREIGN PATENT DOCUMENTS

| | | | |
|---|---|---|---|
| 2916954 | 10/1979 | Fed. Rep. of Germany ........ | 357/72 |
| 54-111768 | 9/1979 | Japan ................................. | 357/72 |
| 54-141568 | 11/1979 | Japan ................................. | 357/72 |
| 0692937 | 6/1953 | United Kingdom ................ | 156/330 |
| 0760420 | 10/1956 | United Kingdom ................ | 156/330 |
| 0768125 | 2/1957 | United Kingdom ................ | 156/330 |
| 0774674 | 5/1957 | United Kingdom ................ | 156/330 |
| 1145434 | 3/1969 | United Kingdom ................ | 156/330 |
| 2028828 | 3/1980 | United Kingdom ................ | 156/330 |
| 2067013 | 7/1981 | United Kingdom ................ | 357/72 |

OTHER PUBLICATIONS

*Encyclopedia of Polymer Science and Tech.* vol. 10, p. 51, Wiley N.Y. 1969, p. 92.
*Handbook of Epoxy Resins*, Lee et al., McGraw-Hill 1967, Chapter 11, p. 15.

*Primary Examiner*—Andrew J. James
*Assistant Examiner*—Jerome Jackson
*Attorney, Agent, or Firm*—Antonelli, Terry & Wands

[57] ABSTRACT

In a resin packaged semiconductor device including a semiconductor element, the back side of which is bonded to a support and the front side of which has electrodes which are electrically connected to electroconductive portions by fine leads, when an adhesive composition comprising an epoxy resin, a novolak type phenolic resin, a solvent for the both resins and a powdery filler, and if necessary, a curing accelerator and a coupling agent, is used for binding the semiconductor and the support, the resulting semiconductor device is excellent in moisture resistance and corrosion resistance.

22 Claims, 2 Drawing Sheets

FIG. I
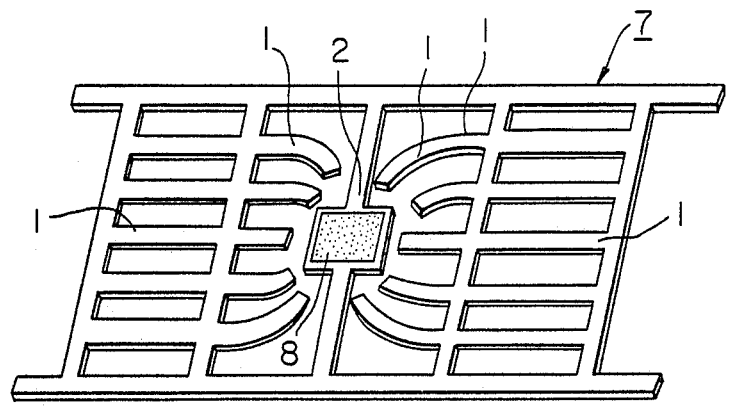
FIG. 2
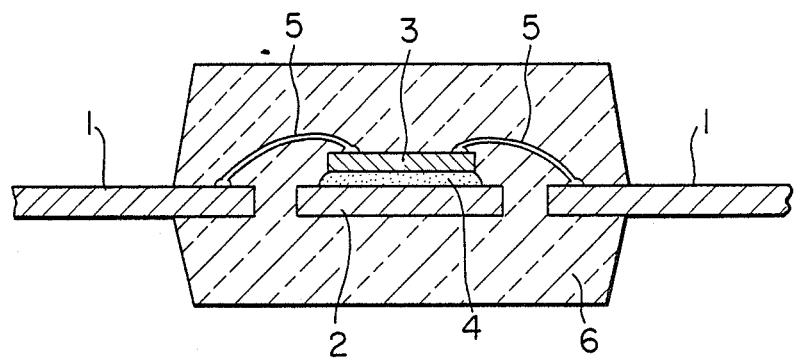

SEMICONDUCTOR DEVICE AND PROCESS FOR PRODUCING THE SAME

This invention relates to a semiconductor device including a semiconductor element fixed to a supporting member with an organic adhesive and to a method of manufacturing the same.

There is known a semiconductor device in which a semiconductor element prepared from a semiconductor pellet is fixed to a supporting member of a metallic material with a paste containing an organic material. As for the paste, there is known an system such as, for example, Able Bond 826-1 (a trademark of a product supplied by Able Stick, Laboratories). In the final stage of manufacture, most of the semiconductor devices are embedded in a resin and supplied in the form of resin-packaged type.

The present inventors, however, found that the resin-packaged semiconductor device assembled by using a conventional paste presents such problems associated with the moisture resistance that the aluminum wiring, electrodes, or the bonded area of a semiconductor element becomes deteriorated due to corrosion or the leak current between electrodes becomes increased by the following reasons:

(i) During the hardening (curing) of the paste by heating, those vapors of low molecular weight organic compounds containing such elements as C, H, and O which are liberated from the paste materials are adsorbed on the surface of semiconductor element and interferes with the adhesion between the packaging resin and the semiconductor element. Under such conditions, if the moisture of the exterior environment penetrated into the package, the semiconductor element and the packaging resin easily become separated at the interface to give voids, and resulting in accelerated corrosion of the aluminum wiring and the bonded area.

(ii) The paste material contains as impurities such corrosive halogen ions as hydrolytic chloroions, bromide ions, etc. which, on being eluted, corrode the wiring or the electrode on the surface of element.

(iii) The hardened resin in the paste material is readily subject to hydrolysis and tends to cause the formation of voids containing moisture, as in the case of (ii), resulting in corrosion of the wiring.

An object of this invention, therefore, is to provide a semiconductor device excellent in moisture resistance or corrosion resistance as well as to provide a method of its manufacture.

Another object of this invention is to provide a semiconductor device of the resin-packaged type excellent in moisture resistance or corrosion resistance.

This invention is characterized in that in binding together a supporting member and a semiconductor element, in due consideration of the moisture problem, use is made of an adhesive composition (mixture) of materials in paste form comprising (1), (2), (3) and (5) selected from the following substances (1) to (6), or an adhesive composition in paste form comprising the substances (1) to (5), or preferably an adhesive composition in paste form comprising all of the substances from (1) to (6):

(1) An epoxy resin (preferably having two or more epoxy radicals in one molecule).
(2) A novolak type phenolic resin.
(3) A solvent capable of dissolving both the above-noted epoxy resin and novolak type phenolic resin.
(4) An accelerator.
(5) A conductive or insulating powdered filler.
(6) A coupling agent.

In the accompanying drawings,

FIG. 1 is an oblique view of a lead frame used in the semiconductor device of this invention;

FIGS. 2 to 4 are sectional views of respective examples of the semiconductor devices according to this invention.

Figure 3:
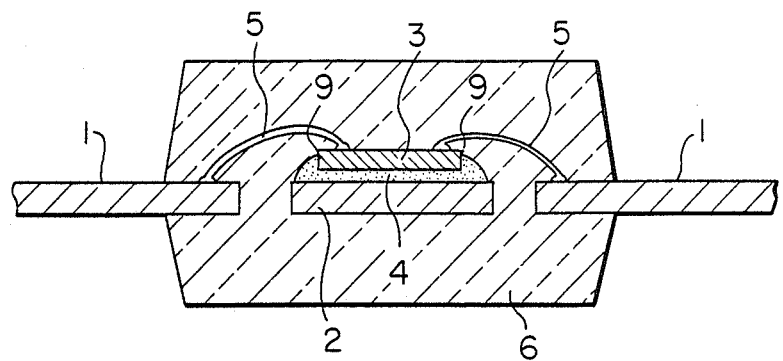

The ingredients which compose the adhesive composition are described in detail.

(1) The epoxy resin having in the same molecule two or more epoxy groups and plays a role of main material:

Examples of such epoxy resins include bifunctional epoxy compounds such as diglycidyl ether of bisphenol A-type, diglycidyl ether of bisphenol F, vinylcyclohexane diepoxide, and the like, and trifunctional or higher functional epoxy compounds such as triglycidyl ether of p-aminophenol, polyglycidyl ether of novolak type phenolic resin, and the like.

(2) The novolak type phenolic resin which acts as hardener:

Novolak type phenolic resins which are used include those formed by the reaction of a phenol or a phenol derivative with formaldehyde or p-formaldehyde, such as a novolak type phenolic resin using phenol as a starting material, a novolak type cresol resin using cresol as a starting material, a novolak type xylene resin using xylenol as a starting material, etc.

(3) The solvent capable of dissolving both the epoxy resin and the novolak type phenolic resin:

Such solvents include aromatic solvents such as toluene, xylene, etc., ketonic solvents such as acetone, methyl ethyl ketone, etc.; and solvents of the ether glycol type such as ethyl Cellosolve, butyl Cellosolve, etc. If the boiling point of the solvent is too low, the paste coated on a supporting member will become a dry state (tack-free state) before a satisfactory bond with the semiconductor element is formed, resulting in insufficient adhesion, while a solvent having a too high boiling point presents a problem of residual solvent after hardening. In view of this, a solvent boiling between 120° and 180° is preferred. The Cellosolve-type solvents such as butyl Cellosolve are particularly preferred from the viewpoints of boiling point as well as wettability of the adherend. Further, it is possible to use several solvents in combination for the purpose of extending the tack free time or for other purposes.

(4) The accelerator:

Known products may be used for the hardening accelerator. Imidazole type compounds, quaternary phosphonium compounds and borates such as tetrasubstituted borates are particularly useful.

(5) Conducting or insulating powdered filler:

The filler retards the evaporation of solvents and facilitates the operation of coating the paste on a supporting member. A primary object of adding a filler is to improve workability of the paste. Further objects of the addition of a filler are to improve bond strength and to improve moixture resistance of the paste. Particularly when powdered silver is used as the filler, it is possible to impart electric conductivity to the paste and to improve thermal conductivity of the paste when it is intended to dissipate the heat generated from the semiconductor element to the supporting member. The fillers suitable for use include, in addition to the powdered silver, carbon powders such as graphite and carbon black as well as a mixture of carbon powder and silver powder. Further, for the purposes of improving the bonding strength and of giving thixotropy (viscosity change of the paste on mixing) to the paste, it is also possible to use powders of silica, metal oxides and silica glass in combinations as required.

The silver powder for use as electroconductive powder should be preferably 5 μm or less in particle size. This is because if the agglomerates are formed in the paste from the silver powder of greater than 5 μm in particle size, the gap between the semiconductor element and the supporting electrode will become larger than the normal thickness of the adhesive layer (5 to 40 μm) so that the adhesion between the semiconductor element and the supporting electrode becomes nonuniform, resulting in insufficient bonding strength. The silver powder content of the paste is preferably 15 to 50% by volume based on a total volume of the epoxy resin, novolak type phenolic resin and silver powder. If it is less than 15% by volume, the volume resistivity becomes $10^{-2}$ Ω·cm or more and fluctuated, leading to technical disadvantage, while if it is larger than 50% by volume, the tack range becomes as small as 5 minutes, giving rise to the technical disadvantage such that a slight disturbance in the manufacturing steps will result in insufficient bonding of the adherents.

(6) The coupling agent of the silane type, aluminum type or titanium type to improve the bonding power of the paste:

For instance, a silane coupling agent is used to improve the adhesive strength between a silicon semiconductor element and the paste. Although not a necessary condition, the addition of a coupling agent is favorable to a high adhesive strength.

According to this invention, the above-mentioned paste is coated over the area of the surface of a supporting member (tab) where the semiconductor element is to be fixed, and then heat treated, whereby the supporting member and the semiconductor element are bonded or bound together. The paste can be applied in excess to the supporting member surface so that it may cover the side faces of semiconductor element to improve the moisture resistance of the finished semiconductor device.

Further, according to this invention, the aforementioned paste can be used not only for the bonding of a semiconductor element and a supporting member, but also as a surface protective film to cover the electrodes and others provided on the surface. By such means, the finished resin-packaged semiconductor device can be improved in moisture resistance.

The invention is further illustrated below with reference to the drawings and Examples.

FIG. 2 illustrates a finished semiconductor device assembled according to this invention. Numeral 1 indicates a plurality of outgoing lead wires provided in correspondence to the aluminum electrodes of a semiconductor element. Numeral 2 indicates a supporting member (tab) to mount and fix the semiconductor element and is made of Fe—Ni—Co alloy similarly to the lead wire 1. Numeral 3 indicates a semiconductor element comprising, for example, an integrated circuit (IC) element provided on a silicon semiconductor substrate (pellet) by the planar technique. On the front main face, are provided aluminum wiring or the like (not shown in the drawing) and output electrodes (not shown in the drawing). Numeral 4 indicates a paste to bond or fix the backside of semiconductor element 3 to the supporting member 2. This paste has a specific composition according to this invention. The examples of the paste compositions are described later. Numeral 5 indicates fine lead wire electrically connecting the output electrode provided on the front main face of the semiconductor element to the corresponding outgoing lead wire 1. This fine lead wire is made of, for example, gold (Au) and bonded by a known wire bonding technique to the electrode on the main face of semiconductor element 3 and to lead wire 1. Numeral 6 indicates the resin packaging material formed by a known transfer molding technique.

The method of making the device is as described below.

The binder paste is prepared in the following manner: Prescribed amounts of an epoxy resin, a phenol novolak resin and a solvent are charged into a reactor with stirrer provided with a heating device and heated at a temperature of 80° C. or above, preferably 90° to 110° C. to form a uniform solution. If the phenol novolak resin contained unreacted phenol or a dimer in amounts exceeding a certain limit, the hardened resin tends to become inferior in heat resistance. Therefore, if the existence of the said impurities is confirmed by gel-permeation chromatography (GPC) or other means, it is necessary to remove then by vacuum distillation or the like. The amount of the novolak type phenolic resin is preferably in such a range that the ratio of the number of phenolic hydroxyl groups to the number of epoxy groups be from 0.5 to 1.5/1 in order to obtain a desirable glass transition temperature and a desirable hardenability. The said solution is admixed with one or more accelerators and fillers and uniformly milled and mixed in a stirring and mixing machine to obtain an intended paste.

The paste is then coated on a supporting member (tab) 2 for the lead frame 7. The lead frame should be thoroughly washed previously. The paste is, then, applied in a shape as shown by 8 in FIG. 1 by means of a dispenser or printing.

Subsequently, the semiconductor element 3 is placed on the supporting member 2 and slightly pressed so as to bind the semiconductor and the supporting member well. Then, the paste is cured by heating at a temperature of 120° C. or higher, preferably 150° to 220° C., for 1 to 10 hours. After this fine lead wires 5 as shown in FIG. 2 are bonded according to a conventional technique, a resin packaging material 6 is formed by a conventional transfer molding technique. After molding the resin packaging material 6, the frame portion of the lead frame 7 shown in FIG. 1 is cut so as to give a semiconductor device having a plurality of outgoing lead wires 1.

In the above-mentioned procedure, the amount of paste to be coated on the tab 2 can be controlled so that when semiconductor element 3 is bonded to the tab 2, the hardened paste 4 will just cover the area of back main face of the semiconductor element as shown in FIG. 2, or the hardened paste will cover also the side faces 9 as shown in FIG. 3. When the paste is applied in excess so that the excess paste 4 will be squeezed out to cover the side faces 9 as shown in FIG. 3, the adhesion deterioration between the semiconductor element and the tab can be improved and, at the same time, the delamination between the tab 2 or the semiconductor element 3 and the resin packaging material 6 can also be prevented. In such a way, the penetration of moisture from the supporting member 2 to the front main face of semiconductor element 3 through side faces can be prevented, resulting in a decrease in number of occasions of corrosion of the aluminum electrode.

The composition of the paste used in the above example and its preparative procedure are described below with reference to concrete examples.

Paste Preparation, Example 1

The ingredients (a), (b) and (c), which are an epoxy resin, a novolak type phenolic resin and a solvent, respectively, in the following formulation were stirred for one hour with heating at 100° C. in a 300-ml flask provided with a reflux to form a uniform solution. The resulting solution was charged into a mortar. To the mortar, were added prescribed amounts of the ingredients (d), (e) and (f), which are a hardening accelerator, a filler and a silane coupling agent, respectively. The mixture was ground for 2 hours to prepare a resin composition containing powdered silver.

| | Parts by weight |
|---|---|
| (a) Epoxy resin (Epikote 1001, manufactured by Shell Chemical Co.) | 100 |
| (b) Novolak type phenol resin (average molecular weight 800) | 29 |
| (c) Butyl Cellosolve | 106 |
| (d) 2-Undecylimidazole (C112, manufactured by Shikoku Kasei Co.) | 1 |
| (e) Powdered silver (average particle size 1.2 μm) | 41 |
| (f) γ-Glycidoxy-propyl-trimethoxy-silane (KBM-403, made by Shin-etsu Chemical Industry Co.) | 0.1 |

In the above recipe, the quantity of each ingredient was based on 100 parts by weight of the epoxy resin (a) in the recipe. The silane coupling agent (f) had been added in order to improve the strength of bond toward the back main face of the silicon semiconductor element.

Paste Preparation, Example 2

In a manner similar to that described in above-mentioned Example 1, a resin composition of the following formulation was prepared.

| | Parts by weight |
|---|---|
| (a) Novolak type cresol resin (ECN1273 made by CIBA Co., Ltd.) | 100 |
| (b) Novolak type phenolic resin (average molecular weight 800) | 60 |
| (c) Ethyl Cellosolve | 150 |
| (d) Triethyl ammonium tetraphenylborate | 2 |
| (e) Powdered silver (average particle size 1.2 μm) | 80 |
| (f) KBM 403 of Shin-etsu Chemical Industry Co. | 0.5 |

In the above formulation, (a) is an epoxy resin, (b) a novolak type phenol resin, (c) a solvent, (d) hardening accelerator, (e) a filler, and (f) a silane coupling agent.

The above pastes obtained in Examples 1 and 2 were excellent in moisture resistance.

The present inventors compared the characteristics of the above two pastes with those of a paste prepared in a similar manner using an acid anhydride as the hardening accelerator (b) according to the following formulation.

Comparative Example

| | Parts by weight |
|---|---|
| (a) Epikote 1001 | 100 |
| (b) Methyl-tetrahydrophthalic anhydride (HN-2200 made by Hitachi Chemical Co., Ltd.) | 52 |
| (c) Butyl Cellosolve | 75 |
| (d) 2-Ethyl-4-methylimidazole (2E4MZ of Shikoku Kasei Co.) | 2 |
| (e) Powdered silver (average particle size 1.2 μm) | 60 |
| (f) KBM 403 (Shin-etsu Chemical Industry Co.) | 0.1 |

The pastes of the above-mentioned Preparative Examples 1 and 2 and Comparative Example were each cast into a metallic Petri disk to a depth of about 2 mm and heat-treated at 120° C. for 24 hours, then at 180° C. for 5 hours. The cast specimens thus formed were tested for PCT moisture absorption ratio, pH of the extract water, electric conductivity and chloride ion concentration. The results obtained were as shown in the table.

TABLE

| | Preparative Example 1 | Preparative Example 2 | Comparative Example |
|---|---|---|---|
| PCT water absorption (% by weight) | 1.1 | 0.6 | 8.6 |
| Aqueous extract | | | |
| pH | 4.2 | 4.7 | 3.9 |
| Conductivity (μΩ/cm) | 57 | 38 | 170 |
| Chloride ion concentration (ppm) | 1.2 | 0.8 | 3.0 |

The characteristic values shown in the table were obtained by the following methods:

PCT (pressure cooker test) water absorption: The weight increase (%) of a specimen, 10×10×1 mm, after having been left standing under a steam atmosphere at 121° C. and 2.0 atmospheres for 20 hours.

Preparation of aqueous extract: 10 g of a ground sample which had passed through a 100-mesh screen was put in 50 g of purified water, left standing for 20 hours at 100° C., and filtered through a No. 5 C filter paper.

pH: Determined by means of a pH meter.

Electric conductivity: The electric conductivity of the sample was measured by means of a conductivity meter.

Chloride ion concentration: The chloride ion concentration of a sample was determined by means of an ion meter provided with electrodes for the chloride ion concentration determination.

It is found from the results that the samples of Preparative Examples 1 and 2 are excellent in moisture resistance, because they are more difficultly hydrolyzable and contain less impurities.

As described above, the semiconductor device has improved moisture resistance, because in bonding the semiconductor elements, use is made of a paste which is improved in moisture resistance by using a novolak type phenolic resin as hardening agent, and said resin has low hydrolyzable chloride ion concentration. Further, since a solvent such as butyl Cellosolve having no harmful effect on the surface of semiconductor element is used, the paste can prevent the aluminum wiring from acceleration of the corrosion.

The results of tests performed similarly to the above-mentioned pressure cooker test on the semiconductor device of this invention revealed that as compared with a semiconductor device assembled by using a conventional paste, the device of this invention shown in FIG. 2 showed a five-fold increase in service life (the time elapsed before 50% of the samples under test became defective in electric characteristics owing to the corrosion or disconnection of aluminum electrode or wiring on the surface of semiconductor element).

Figure 4:
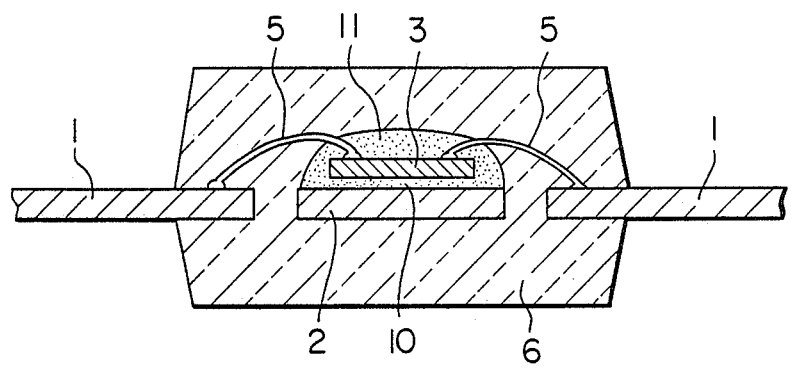

FIG. 4 shows another example of the semiconductor device according to this invention. In FIG. 4, the same notations as used in FIG. 2 have the same meanings as in FIG. 2. In the present example, the bond between the semiconductor element 3 and the supporting member 2 is formed with an insulating paste 10. In this paste, an insulating powder such as silica glass is used in place of the conductive silver powder used in the preceding example. Before transfer molding of the resin packaging material a protective film 11 is formed to cover the front main face of semiconductor element 3 by applying the same paste as used in bonding the semiconductor element 3 to the supporting member 2 and hardening the applied coating by heat treatment. Thereafter, the resin packaging material 6 is formed. In this semiconductor device, since the semiconductor element 3 is perfectly covered with the paste 10 and paste 11, the aluminum electrodes provided on the front main face of semiconductor element 3 are more completely protected from corrosion. Further, such a device is protected also from soft errors caused by undesirable radiations such as α particles and is effectively applicable particularly to a semiconductor memory device.

As is clear from the foregoing description, the present invention is very effective particularly in improving the moisture resistance of a resin-packaged semiconductor device. Moreover, the principle of this invention can be utilizable in other sealing systems such as ceramic-packaged type. Thus various modifications are possible without departing from the gist of this invention.

What is claimed is:

1. A semiconductor device comprising a semiconductor element, the back main face of which is fixed to a supporting member with an adhesive layer formed by heat-curing an adhesive composition to bond the semiconductor element through its back main face to the supporting member, the adhesive composition comprising an epoxy resin, a novolak-type phenolic resin as a hardener, a solvent capable of dissolving both of said resins, and powdered silver, said adhesive layer being positioned between the back main face and the supporting member.

2. A device according to claim 1, wherein the solvent is butyl Cellosolve.

3. A device according to claim 1, wherein the powdered silver has a particle size of 5 μm or less and the powdered silver content in the adhesive composition is 15% to 50% by volume based on the total volume of the epoxy resin, the novolak-type phenolic resin, and the powdered silver.

4. A device according to claim 1, wherein the adhesive composition further comprises at least one material selected from the group consisting of hardening accelerators and coupling agents.

5. A semiconductor device according to claim 1, wherein said epoxy resin has at least two epoxy groups.

6. A semiconductor device comprising a semiconductor element, the back main face of which is fixed to a supporting member with an adhesive layer formed by heat-curing an adhesive composition to bond the semiconductor element through its back main face to the supporting member, the adhesive composition comprising an epoxy resin, a novolak-type phenolic resin as a hardener, a solvent capable of dissolving both of said resins, and powdered silver, said adhesive layer being positioned between the back main face and the supporting member, the front main face of said semiconductor element carrying an electrode connected electrically to an electroconductive member through a fine lead wire, and said semiconductor element, said supporting member, and said lead wire being encapsulated with a resin packaging material.

7. A semiconductor device according to claim 6, wherein said resin composition includes at least one material selected from the group consisting of hardening accelerators and coupling agents.

8. A semiconductor device comprising a semiconductor element, the back main face of which is fixed to a supporting member with an adhesive layer formed by heat-curing an adhesive composition to bond the semiconductor element through its back main face to the supporting member, the adhesive composition comprising an epoxy resin, a novolak-type phenol resin as a hardener, a solvent capable of dissolving both of said resins, and powdered silver, the adhesive layer being positioned between the back main face and the supporting member, the front main face of said semiconductor element carrying an electrode connected electrically to an electroconductive member through a fine lead wire, the side faces of said semiconductor element being covered with the same material as that of said adhesive layer, and said semiconductor element, said supporting member, and said lead wire being encapsulated with a resin packaging material.

9. A semiconductor device according to claim 8, wherein said resin composition includes at least one material selected from the group consisting of hardening accelerators and coupling agents.

10. A semiconductor device comprising a semiconductor element, the back main face of which is fixed to a supporting member with an adhesive layer formed by heat-curing an adhesive composition comprising an epoxy resin, a novolak-type phenolic resin as a hardener, a solvent capable of dissolving both of said resins, and a powdery filler, said adhesive composition acting to bond the semiconductor through its back main face to said supporting member, said adhesive layer being positioned between the back main face and the supporting member, the front main face of said semiconductor element carrying an electrode connected electrically to an electroconductive member through a fine lead wire, and said semiconductor element, said supporting member, and said lead wire being encapsulated with a resin packaging material, wherein the use of said adhesive composition prevents corrosion of said electrode caused by the adhesive bonding the element to the support member.

11. A semiconductor device according to claim 10, wherein the powdery filler is powdered silver.

12. A semiconductor device according to claim 10, wherein said powdery filler is an electroconductive powdery filler.

13. A semiconductor device according to claim 10, wherein said powdery filler is an insulating powdery filler.

14. A semiconductor device according to claim 10, wherein said resin composition includes at least one material selected from the group consisting of hardening accelerators and coupling agents.

15. A semiconductor device according to claim 10, wherein the adhesive layer is extended to cover the sides of the semiconductor element.

16. A semiconductor device according to claim 10, wherein the adhesive layer is extended to cover the sides and the front main face of the semiconductor element.

17. A semiconductor device according to claim 10, wherein the electrode is made of aluminum.

18. A semiconductor device according to claim 11, wherein the electrode is made of aluminum.

19. A semiconductor device according to claim 6, 8 or 1, wherein the novolak-type phenol resin is a resin formed by the reaction of phenol or a phenol derivative with formaldehyde or p-formaldehyde.

20. A semiconductor device according to claim 6, 8 or 1, wherein the novolak-type phenolic resin is used in an amount to provide a ratio of the number of phenolic hydroxyl groups to the number of epoxy groups of 0.5 to 1.5/1.

21. A semiconductor device according to claim 6 or 8, wherein the electrode is made of aluminum, whereby corrosion of the aluminum due to the adhesive used to bond the semiconductor element to the support member is prevented.

22. A semiconductor device according to claim 19, wherein the epoxy resin is selected from the group consisting of diglycidyl ether of bisphenol A-type, diglycidyl ether of bisphenol F, vinylcyclohexane diepoxide, triglycidyl ether of p-aminophenol, and polyglycidyl ether of novolak-type phenolic resin.

* * * * *